FREQUENCY SWITCHING DEVICE

Filed Sept. 11, 1963 2 Sheets-Sheet 1

Inventor
T. HUKAMI
T. TOMIZAWA
By R P Morris
Attorney

FREQUENCY SWITCHING DEVICE

Filed Sept. 11, 1963 2 Sheets-Sheet 2

Inventor
T. HUKAMI
T. TOMIZAWA
By
Attorney 3,296,550

FREQUENCY SWITCHING DEVICE

Tadasu Hukami and Tadashi Tomizawa, Minato-ku, Tokyo, Japan, assignors to Nippon Electric Company, Limited, Tokyo, Japan, a corporation of Japan Filed Sept. 11, 1963, Ser. No. 308,229
Claims priority, application Japan, Sept. 11, 1962, 37/39,139
4 Claims. (Cl. 331—49)

Figure 1:
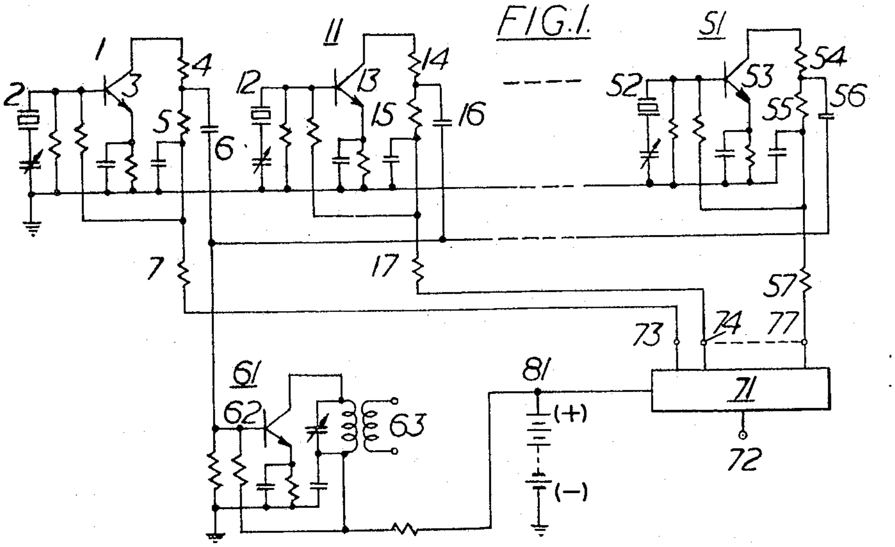

This invention relates to a frequency switching device and in particular to such a device as employing an electronic switching device for a switching section of a multifrequency selection switching equipment in a mobile radio communication set.

The conventional devices that have been reduced to practice for such switching purposes are normally composed of a plurality of frequency reference circuits containing quartz-crystals, for example, and a switching means for enabling any one of the frequency reference circuits to be selectively connected to a single oscillator so that any desired oscillation frequency may be obtained. Application of an electronic switching mechanism in such a frequency switching device for the purpose of enhancing the speed or of improving reliability of the switching device invariably encounters difficulties in deriving an accurate and stable oscillation frequency because the stray capacitance and the residual resistance components inherently present in the electronic switching mechanism are connected between a desired frequency reference circuit and the oscillator. In particular, the effect of the stray capacitance becomes a predominant factor when the oscillation frequency reaches as high as several megacycles per second. Therefore application of such a device in practical use would be difficult unless some special electronic switching mechanism is provided.

An object of this invention is to eliminate a deleterious effect of the switching mechanism on frequency accuracy and to obtain stabilized and reliable frequency switching operation of a frequency switching device.

Another object of this invention is to obtain a switching device involving electronic switch which is interlocked with a power supply voltage to minimize mutual interference that would otherwise be present among oscillator output circuits.

According to this invention each of a plurality of frequency reference circuits is combined with a separate oscillator circuit to constitute an independent oscillator circuit. In one embodiment of this invention, all of the oscillators are connected in shunt and a power supply voltage is applied through an electronic switching device to a particular oscillator of the desired oscillation frequency for initiation of oscillation. Thus an output at the desired oscillation frequency can be derived. Another embodiment of this invention is so composed that the outputs of a plurality of oscillators may be connected in shunt through electronic switches each using a semiconductor elements such as a diode or transistor. A power supply voltage may be applied to an oscillator of the desired oscillation frequency alone through an electronic switching device to initiate oscillation, and the electronic switch connected to the output circuit of the oscillator which has initated oscillation by the power supply voltage may operate smultaneously to isolate the deleterious effect of the output circuits of the remaining oscillator circuits and to obtain an output at the desired oscillation frequency.

Figure 2:
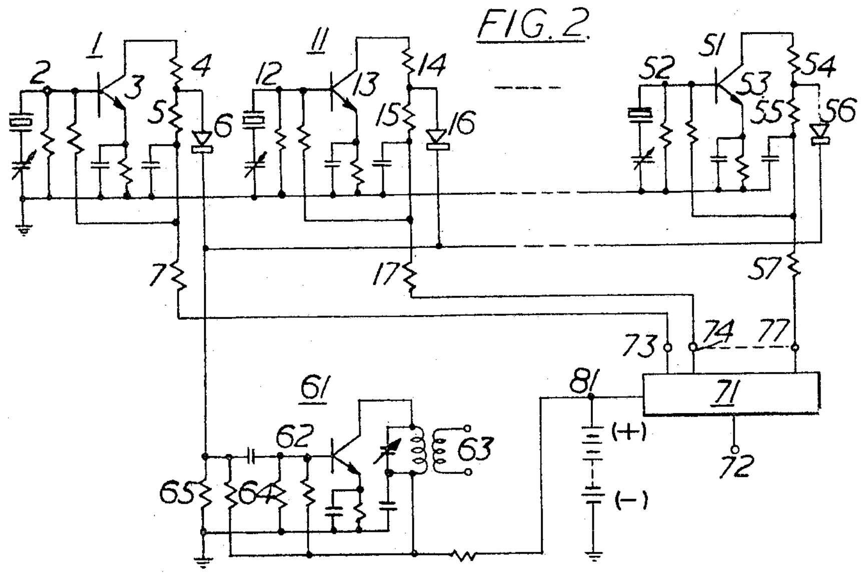
Figure 3:
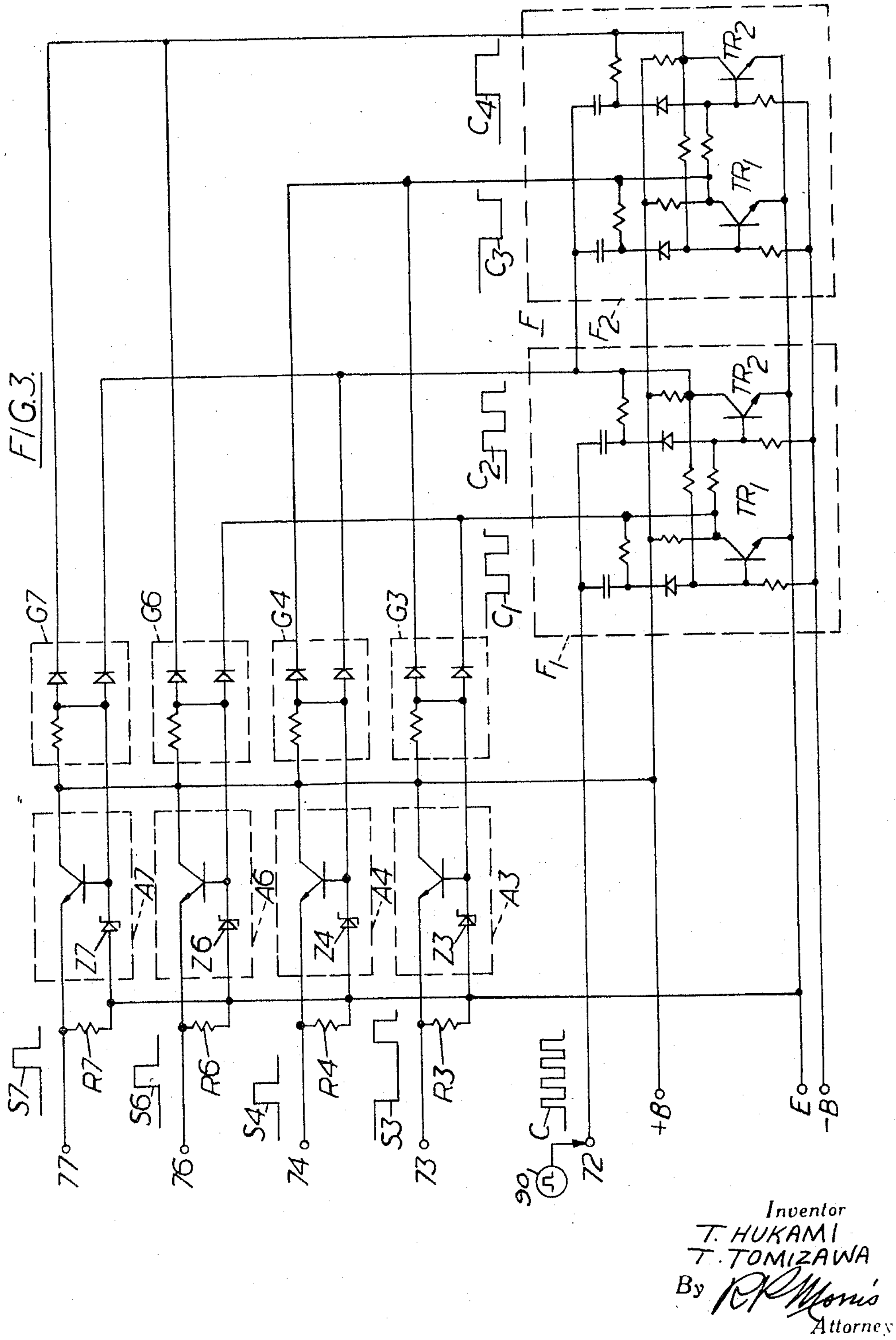

The above mentioned and other features and objects of this invention and the manner of attaining them will become more apparent and the invention itself will best be understood by reference to the following description of an embodiment of the invention taken in conjunction with the accompanying drawings wherein:

FIGS. 1 and 2 are circuit diagrams of two embodiments of frequency switching device according to the invention, and FIG. 3 the circuit diagram of a switching circuit used in these embodiments.

FIG. 1 shows a first embodiment of this invention, wherein numerals 1, 11, . . . , 51 denote oscillators consisting of frequency reference circuits 2, 12, . . . , 52 combined with oscillator circuits containing transistors 3, 13, . . . , 53 as active elements, respectively.

A plurality of these oscillator outputs undergo voltage division respectively by load resistors 4, 14, . . . , 54 and 5, 15, . . . , 55, pass through coupling capacitors 6, 16, . . . , 56 to be supplied in common to a base electrode 62 of a buffer amplifier 61. A numeral 71 denotes an electronic switching device provided with an input terminal 72 and a plurality of output terminals 73, 74, . . . , 77 which are equal in number to the oscillators. An input signal from pulse source 90 is applied to the input terminal 72, operates the electronic switching device 71 to connect power supply 81 to a selected one of the output terminals 73, 74–77, for example, at the output terminal 73, while all of the remaining terminal 74–77 are maintained at ground potential. The output terminals 73, 74, . . . , 77 are respectively connected to power supply circuits of the oscillators 1, 11, . . . , 51 through decoupling resistors 7, 17, . . . , 57. Thus the power supply voltage will be applied to the oscillator 1 alone in the above-mentioned case so that the oscillator 1 initiates oscillations at a frequency determined by the frequency reference circuit 2; but the power supply voltages for the remaining oscillators 11–51 are maintained at ground potential so that the remaining oscillators initiate no oscillations. Thus the oscillation output of the oscillation 1 alone is applied to the base electrode 62 of the buffer amplifier 61 where it is amplified before appearing at an output terminal 63. When a signal is applied to the input terminal 72 of the electronic switching device 71 such as for enabling a power supply voltage to appear at the output terminal 74, for example, an output at a frequency determined by the frequency reference circuit 12 of the oscillator 11 appears in like manner at the output terminal 63 of the buffer amplifier 61. This is to say that by applying a required signal to the input terminal 72 of the electronic switching device 71, an output at any desired frequency among frequencies determined by a plurality of the frequency reference circuits 2, 12, . . . , 52 can be derived from the output terminal 63 of the buffer amplifier 61.

The electronic switching device 71 may be composed by using a publicly known circuit such as a binary counter or a ring counter that has found an extensive use in digital computers, and the like. Needless to say, a selection signal to be applied to the input terminal 72 may be a coded pulse train corresponding to the oscillator No. of an oscillator whose oscillation frequency is to be selected. In FIG. 3 a suitable switching circuit is illustrated in detail.

A circuit diagram of an example of the electronic switching device 71 is shown in FIG. 3. As in shown in the drawing, the switching device 71, which has only four output terminals 73, 74, 76 and 77 corresponding to the reference numerals of FIGS. 1 and 2 for convenience of explanation, comprises a pulse counter F of known type composed of a pair of flip flop circuits $F_1$ and $F_2$ connected in series with each other and supplied from input terminal 72 with a switching control pulse signal C which is a pulse train as shown in FIGURE 3. Operating power is supplied from the voltage source terminals +B and −B to the flip flop circuits $F_1$ and $F_2$. At the output terminals of the flip flop circuits $F_1$ and $F_2$, the output pulses $C_1$, $C_2$, $C_3$ and $C_4$ are produced in response to the control pulse signal C, which are in turn applied to the input terminals and AND gates $G_3$, $G_4$, $G_6$ and $G_7$ in the known combination as illustrated. To the respective output terminals of the AND gates, D.C. amplifiers $A_3$, $A_4$, $A_6$ and $A_7$ are connected, respectively, collectors of which are connected in common to the voltage source terminal +B, while bases of which are connected to the ground potential terminal E by means of Zener diodes $Z_3$, $Z_4$, $Z_6$ and $Z_7$, respectively, and the emitters of which are connected to the output terminals 73, 74, 76 and 77 and to the terminal E by means of the output resistors $R_3$, $R_4$, $R_6$ and $R_7$, respectively. At the output terminals 73, 74, 76 and 77, the power supply voltage of waveforms $S_3$, $S_4$, $S_6$ and $S_7$ are consequently obtained, in response to the input control pulse C. As is clearly understood from the drawing, the output terminal from which the output power supply voltage is produced is shifted one by one in response to each of the control pulse C. By way of arrangement the time position of each of the control pulse C, the output power voltage of any waveform (time duration) can be obtained at the desired output terminal among the terminals 73, 74, 76 and 77.

The reason why the outputs of oscillators are extracted through voltage division by the load resistors 4, 14, . . . , 54 and 5, 15, . . . , 55 in this embodiment is that degradation in stability of the oscillation frequency due to the loading effect at the output circuit of the operating oscillator by the output circuits of those oscillators not operating, all of which are connected in common through the coupling capacitors 6, 16, . . . , 56, must be kept as small as possible. For voltage division, capacitors may be used in lieu of the resistors. Further, there may be no need for voltage division, if the number of oscillators to be connected in shunt is small or if the oscillation frequencies are widely different.

FIG. 2 shows a second embodiment of this invention. The principal circuits used for this embodiment are similar to those used for the first embodiment, excepting that the outputs of the oscillators after they are extracted through the voltage dividers consisting of load resistors 4, 14, . . . , 54 and 5, 15, . . . , 55 are connected in shunt via diodes 6, 16, . . . , 56 for subsequent connection to a bias circuit composed of resistors 64 and 65.

In this case, the diodes 6, 16, . . . , 56 and the bias circuit composed of the resistors 64 and 65 constitute a most simple electronic switching circuit. Let a case be taken as an example in which the power supply voltage appears at the output terminal 73 alone of the output terminals 73–77 of the electronic switching device 71 and hence, the oscillator 7 is in oscillation state. Since a bias voltage which has been obtained by voltage-division from the power supply voltage by the resistors 64 and 65, and which is negative with respect to ground potential is applied to the anode side of the diodes 6, 16, . . . , 56, the diodes 16, . . . , 56 connected to the output side of those oscillators 11, . . . , 51 whose power supply circuits are kept at ground potential are biased in the backward direction to be placed under cut-off conditions and hence, to disconnect respective output circuits from the parallel connection point; whereas since the power supply voltage applied to the oscillator 1 also applies a bias across diode 6 in the forward direction placing it in conducting condtion, connecting the output side of the oscillator 1 to the base electrode 62 of the buffer amplifier 61.

The feature of this electronic switching circuit is in a series of operations that can take place by being interlocked with the power supply such that the output is automatically furnished to the input of buffer amplifier upon the source side voltage becoming equal to the power source voltage while upon the source voltage becoming equal to ground potential, the output circuit is automatically disconnected. The object of this electronic switching circuit resides in disconnecting unnecessary oscillator circuits from the parallel connection point to protect the operating oscillator from deleterious loading effects. It will be understood that the construction of the electronic switching circuit that operates in conjunction with the power supply voltage is by no means restricted to those described previously; any other composition will do insofar as a series of operations as mentioned above is capable.

According to this embodiment it is possible in the same manner as the first embodiment to derive from the output terminal 63 of the buffer amplifier 61 an output at any desired one of oscillation frequencies determined by a plurality of the frequency reference circuits 2, 12, . . . , 52 by applying a required signal to the input terminal 72 of the electronic switching device 71.

When the frequency switching device according to this invention is applied, it is possible to effect switchover among oscillation frequencies above several megacycles per second at an extremely high speed as has been mentioned. This system can also find an effective application where continuous switchover operation must be sustained, which was impractical with a conventional mechanical switching device, because the frequency switching device according to this invention is composed of a combination of an electronic switching mechanism and oscillators and hence, is devoid of parts requiring mechanical connections, featuring longevity combined with high reliability of operation.

Although the invention has so far been described in connection with specific apparatus, various modifications are possible within the scope of the invention such that the transistors employed in the oscillators may be replaced with any semiconductor active elements such as tunnel diodes and the like. It is to be clearly understood therefore that this description is made not as a limitation to the scope of the invention as set forth in the objects thereof and in the accompanying claims.

What is claimed is:

1. A selective frequency system for mobile radio communication, comprising a plurality of separate sources of different radio frequency, means connecting the outputs of said sources in parallel, to a common output terminal, a power supply for said sources, and an electronic switching device for selectively connecting said power supply to a selected one of said sources, whereby only said one selected source is effective;

diode means being connected between the outputs of each of said sources intermediate said sources and said common output terminal; said electronic switching circuit having a plurality of outputs each being connected to one of said sources;

said switching means including means responsive to incoming pulses for unblocking said diodes in a one-at-a-time sequential manner.

2. A system according to claim 1 further comprising single input means for applying a selecting signal to said electronic switching device, and means in said electronic switching device responsive to a predetermined selecting signal for effecting said selective connection.

3. A system for supplying any one of a plurality of frequencies to a common output load, comprising a plurality of semiconductor device oscillators operating at different frequencies, each oscillator having a voltage divider across its output, connecting means coupling an intermediate point of said voltage dividers to a common output lead, a rectifier included in each of said connecting means, bias means; an electronic switching device coupled to said bias means having a plurality of outputs connected to each oscillator; a pulse source selectively operating said switching device to energize said oscillators in a one-at-a-time sequential manner to normally apply a blocking potential to all but one of said rectifiers and to couple said bias means to one of said rectifiers for removing the blocking bias from the said rectifier in the connection associated with said selected oscillator.

4. Frequency switching means comprising;
plural oscillator means each having a different operating frequency;
power supply means;
buffer amplifier means;
plural semiconductor means;
each oscillator means having an output coupled to the input of said buffer amplifier means through an associated semiconductor means;
switching control means;
electronic switching means for selectively coupling said power supply means to said plural oscillator means in a sequential fashion responsive to said switching control means;
said electronic switching means being comprised of a multistage counter means;
each of said stages being a flip-flop;
said flip-flop stages being connected in series fashion;
said switching control means being connected to the input of the first stage;
logical gating circuits having inputs coupled to selected outputs of said flip-flops to enable said logical gating circuits in a sequential fashion;
plural amplifier means each being coupled between said power supply means and an associated oscillator means;
each of said plural amplifier means having a control electrode each being coupled to an associated output of one of said logical gating means;
said switch control means including means for generating pulses to advance the state of said counter means for sequentially enabling said logical gating circuits so as to sequentially energize said plural oscillator means.

References Cited by the Examiner

UNITED STATES PATENTS

| | | | |
|---|---|---|---|
| Re. 25,515 | 1/1964 | Peterson | 84—1.26 |
| 2,460,900 | 2/1949 | Newbold | 331—49 X |
| 2,840,713 | 6/1958 | Wulfsberg | 331—49 |
| 2,929,874 | 3/1960 | Cupella | 331—49 X |
| 2,939,359 | 6/1960 | Markowitz. | |
| 3,105,106 | 9/1963 | Park | 84—1.26 X |

NATHAN KAUFMAN, *Primary Examiner.*

J. B. MULLINS, *Assistant Examiner.*